US010299419B2

(12) United States Patent
Tanaka et al.

(10) Patent No.: US 10,299,419 B2
(45) Date of Patent: May 21, 2019

(54) TAPE FEEDER

(71) Applicant: FUJI CORPORATION, Chiryu-shi (JP)

(72) Inventors: Keita Tanaka, Takahama (JP); Takayuki Mizuno, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/745,604

(22) PCT Filed: Aug. 5, 2015

(86) PCT No.: PCT/JP2015/072236
§ 371 (c)(1),
(2) Date: Jan. 17, 2018

(87) PCT Pub. No.: WO2017/022099
PCT Pub. Date: Feb. 9, 2017

(65) Prior Publication Data
US 2018/0213690 A1 Jul. 26, 2018

(51) Int. Cl.
*H05K 13/02* (2006.01)
*B65H 5/28* (2006.01)
(Continued)

(52) U.S. Cl.
CPC ......... *H05K 13/0417* (2013.01); *B65H 16/10* (2013.01); *B65H 27/00* (2013.01);
(Continued)

(58) Field of Classification Search
CPC ............. H05K 13/021; H05K 13/0408; H05K 13/0417; H05K 13/0419
See application file for complete search history.

(56) References Cited

U.S. PATENT DOCUMENTS 8,006,373 B2 * 8/2011 Choi ................... H05K 13/0417
226/115
2008/0035697 A1 2/2008 Kim
(Continued)

FOREIGN PATENT DOCUMENTS

JP 04066461 A * 3/1992
JP 04076997 A * 3/1992
(Continued)

OTHER PUBLICATIONS

International Search Report dated Oct. 27, 2015 in PCT/JP2015/072236 filed Aug. 5, 2015.
(Continued)

*Primary Examiner* — Mark A Osele
(74) *Attorney, Agent, or Firm* — Oblon, McClelland, Maier & Neustadt, L.L.P.

(57) ABSTRACT

A cassette type tape feeder including a tape feeding device that feeds a component supply tape to a component pickup position from a reel; a cover tape drawing-in device that peels off a cover tape from the component supply tape forward of the component suction position in accordance with a feeding operation of the component supply tape, and draws in the cover tape in a direction opposite to a feeding direction of the component supply tape; and a cover tape collection case that collects the cover tape drawn in by the cover tape drawing-in device. The cover tape collection case is configured of a fixing case section fixed to a cassette case, and a movable case section which expands capacity of the cover tape collection case by being displaced in a direction of the vacant space in the reel corresponding to an increase in collection amount of the cover tape. The movable case section is biased in a reducing direction by a torsion coil spring.

9 Claims, 4 Drawing Sheets

(51) Int. Cl.
*H05K 13/04* (2006.01)
*B65H 16/10* (2006.01)
*B65H 27/00* (2006.01)

(52) U.S. Cl.
CPC ........... *H05K 13/02* (2013.01); *H05K 13/021* (2013.01); *H05K 13/0419* (2018.08)

(56) References Cited

U.S. PATENT DOCUMENTS

| | | |
|---|---|---|
| 2010/0101079 A1 | 4/2010 | Lee |
| 2014/0151490 A1* | 6/2014 | Kobayashi ......... H05K 13/0417 242/522 |

FOREIGN PATENT DOCUMENTS

| | | |
|---|---|---|
| JP | 2008-91675 | 4/2008 |
| JP | 2008-91676 A | 4/2008 |
| JP | 2010-50122 A | 3/2010 |
| JP | 2010-225837 A | 10/2010 |
| JP | 6049036 B2 | 12/2016 |

OTHER PUBLICATIONS

European Patent Office Search Report dated Feb. 1, 2019 for European Patent Application No. 15900410.0-1203.

\* cited by examiner

TAPE FEEDER

TECHNICAL FIELD

The present application relates to a tape feeder including a mechanism that collects cover tape (also called top tape or top film) by peeling off the cover tape from an upper face of component supply tape.

BACKGROUND ART

As described in PTL 1 (JP-A-2010-50122) and PTL 2 (International Publication No. 2014/118994), with a conventional tape feeder, a tape feeder on which a reel around which component supply tape is wound is loaded on a feeder setting table of a component mounting machine, component supply tape drawn out from the reel by a sprocket is pitch fed to a component pickup position, a component in the component supply tape is exposed by peeling off the cover tape from the upper face of the component supply tape forward of the component pickup position, the component is mounted onto a circuit board by being picked up from the component supply tape by a suction nozzle of the component mounting machine at the component pickup position, and the cover tape is peeled from the upper surface of the component supply tape and collected in a cover tape collection section by being drawn in by a cover tape drawing-in device in a direction opposite to a feeding direction of the component supply tape. Furthermore, the component supply tape (carrier tape) from which the cover tape has been peeled off is finally discharged from the tape feeder, and is collected in a waste tape collection box provided in a lower section of the component mounting machine.

CITATION LIST

Patent Literature

PTL 1: JP-A-2010-50122
PTL 2: International Publication No. 2014/118994

SUMMARY

Technical Problem

In recent years, the size and the thickness of tape feeders have decreased in accordance with a decrease in size of components, each mechanism that configures the tape feeder has also been required to be small and thin, and thus, a small and thin cover tape collection section has also been required.

However, when the size and the thickness of the cover tape collection section decrease, it may not be possible to collect the cover tape of the component supply tape for an entire reel, and as a result, it may not be possible to peel off the cover tape forward of the component pickup position, a component suction error may be generated, and the component mounting machine may stop. However, when designing a tape feeder such that a cover tape collection section having a size necessary for collecting the cover tape of the component supply tape for an entire reel is provided, it is not possible to sufficiently satisfy the requirement for the small size and the thin thickness of the tape feeder.

Here, the problem to be solved by the present disclosure is to provide a tape feeder that can collect a cover tape of a component supply tape for an entire reel in a cover tape collection section while satisfying the requirement for the small size and the thin thickness of the tape feeder.

Solution to Problem

In order to solve the above-described problem, the present disclosure provides a tape feeder including: a tape feeding device configured to draw out a component supply tape wound around a reel, and feed the component supply tape to a component pickup position; a cover tape drawing-in device configured to peel off a cover tape from an upper face of the component supply tape forward of the component pickup position in accordance with a feeding operation of the component supply tape, and draw in the cover tape in a direction opposite to a feeding direction of the component supply tape; and a cover tape collection section configured to collect the cover tape drawn in by the cover tape drawing-in device, in which the cover tape collection section is configured to expand to a vacant space in accordance with an increase in collection amount of the cover tape. Here, the vacant space to which the cover tape collection section expands, may be a vacant space on an inner side of a tape feeder, or may be a vacant space on an outer side (for example, a detaching direction side) of the tape feeder when attaching the tape feeder to the component mounting machine.

In the present disclosure, since the cover tape collection section is configured to expand to the vacant space corresponding to the increase in collection amount of the cover tape, by making the cover tape collection section the minimum size at first, it is possible to gradually expand the cover tape collection section corresponding to the increase in collection amount of the cover tape as the tape feeder operates. Accordingly, while satisfying the requirement for the small size and the thin thickness of the tape feeder by reducing the minimum space required to house the cover tape collection section inside the tape feeder, it is possible to collect the cover tape of the component supply tape for an entire reel in the cover tape collection section.

In this case, the cover tape collection section may be configured such that an expandable part thereof expands to the vacant space in the reel that becomes larger in accordance with a decrease in an amount of remaining tape on the reel. According to this, it is possible to efficiently use the vacant space in the reel that becomes larger in accordance with the decrease in the amount of remaining tape on the reel, as the vacant space to which the cover tape collection section expands, thus contributing to reducing the size and the thickness of the tape feeder.

Note that, the reel is loaded on the tape feeder to be exchangeable, but when a state in which the expandable part of the cover tape collection section has expanded to the vacant space in the reel and fits inside the reel occurs, it is not possible to detach the reel in the rotation axial direction, and the expandable part of the cover tape collection section becomes an obstacle that interferes with exchange of the reel. Therefore, when exchanging the reel, it is necessary to return to the state where the expandable part of the cover tape collection section is outside of the reel. In addition, when a state in which the expandable part of the cover tape collection section is strongly pressed to the component supply tape wound around the reel as the tape feeder is operating occurs, a friction force that acts on the component supply tape increases, a load (resistance force) of a feeding operation of the component supply tape becomes excessive, and a problem may occur with feeding operation of the component supply tape.

Here, the present disclosure may be configured such that the expandable part of the cover tape collection section is biased in a reducing direction by a biasing means, the expandable part is pressed by the cover tape packed in the cover tape collection section by the cover tape drawing-in device, and accordingly, the expandable part is pushed out in the expanding direction against a biasing force of the biasing means. According to this, even after feeding operation of the component supply tape is started and the collection of the cover tape in the cover tape collection section is initiated, before the expandable part of the cover tape collection section is moved into the reel, the expandable part of the cover tape collection section is held in a state drawn out from the reel by the biasing means, and thus, it is possible to exchange the reel while that state is maintained. In addition, in a case of exchanging the reel after the state where the expandable part of the cover tape collection section is moved into the reel occurs, simply by an operator taking out the cover tape from the cover tape collection section, the state returns to one where the expandable part of the cover tape collection section is drawn out from the reel by the biasing means, and it is possible to exchange the reel. In addition, while the tape feeder is operating, it is possible to prevent the expandable part of the cover tape collection section from being pressed to the component supply tape wound around the reel by the biasing means, or to mitigate the pressing force, to prevent the load (resistance force) of the feeding operation of the component supply tape from becoming excessive, and to prevent problems with feeding operation of the component supply tape.

The present disclosure may use an elastic material, such as a bellows structure or rubber, as means for configuring the cover tape collection section to be expandable, or may be configured such that the cover tape collection section is configured of a fixed case section, and a movable case section configured to enter and exit the fixed case section, the cover tape collection section is configured to become smaller as the movable case section goes into the fixed case section, and the cover tape collection section expands as the movable case section is displaced from the fixed case section towards the vacant space.

In addition, the present disclosure can be employed in any type of tape feeder as long as the tape feeder is a tape feeder on which the reel is loaded, and for example, the reel, the tape feeding device, the cover tape drawing-in device, and the cover tape collection section may be employed in a cassette type tape feeder provided in the cassette case. Since cassette type tape feeders are particularly small and thin, in this case the effects of employing the present disclosure are large.

DESCRIPTION OF EMBODIMENTS

Figure 1:
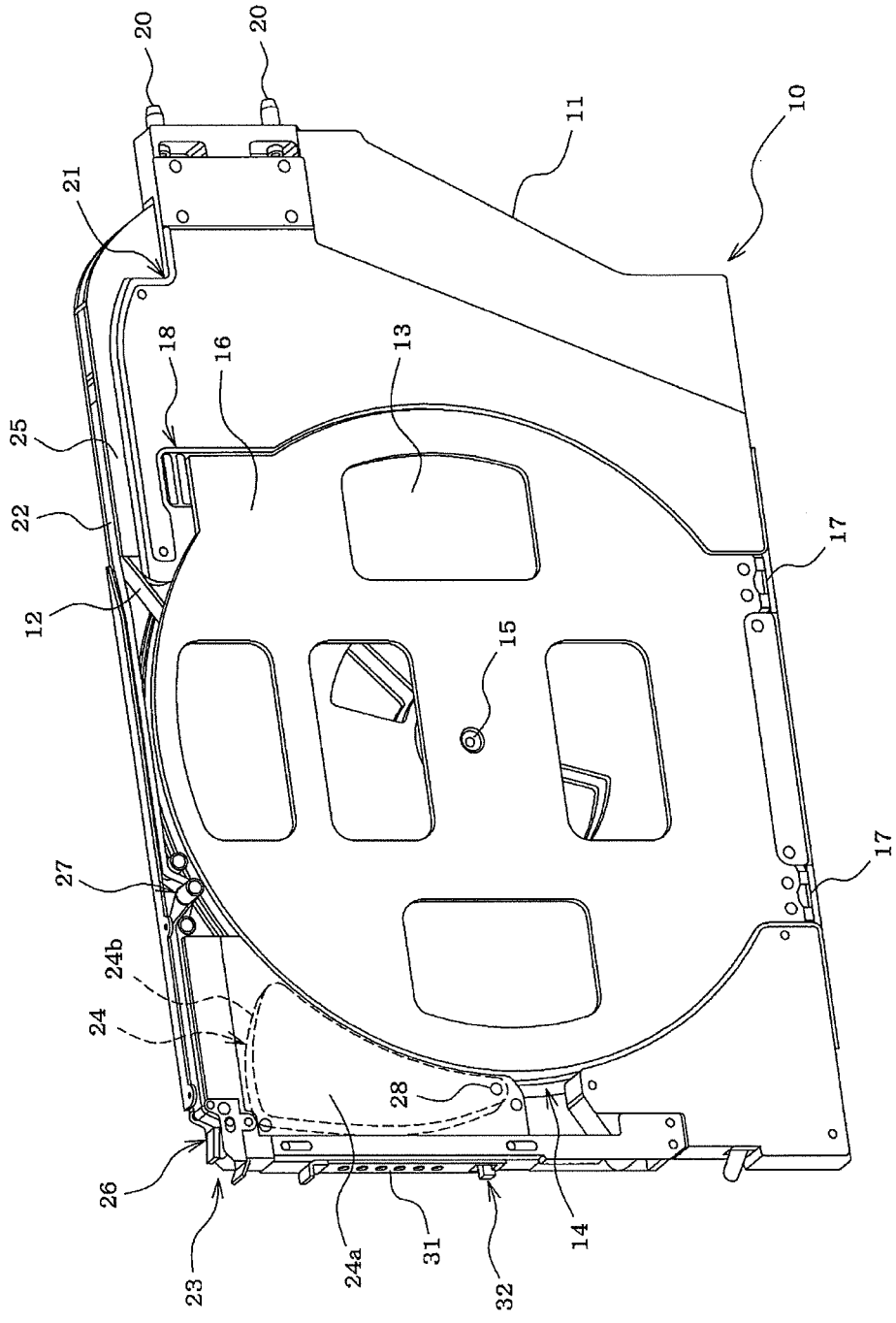
FIG. 1 is a perspective view illustrating a cassette type tape feeder of an embodiment of the present disclosure.

Hereinafter, an embodiment of the present disclosure, a cassette type tape feeder, will be described.

Cassette case 11 of cassette type tape feeder 10 is formed of a metal plate or a plastic plate, and is small and thin. Reel loading section 14 in which is loaded reel 13, around which is wound component supply tape 12, is provided in cassette case 11 in an exchangeable (attachable and detachable) manner. At the center of reel loading section 14, reel holding shaft 15 that holds reel 13 is rotatably provided. In cassette case 11, reel pressing cover 16 that opens and closes reel loading section 14 is attached via hinge 17, and lock mechanism 18 that locks and unlocks reel pressing cover 16 at a closed position is provided. During exchange of reel 13, after an operator exchanges reel 13 by unlocking lock mechanism 18 and opening reel pressing cover 16, when closing reel pressing cover 16, a state occurs where reel pressing cover 16 is automatically locked at the closed position by the lock mechanism 18. However, similar to the unlocking operation, the locking operation of lock mechanism 18 may also be configured to be manually operated by an operator.

In cassette case 11, tape feeding device 21 that feeds component supply tape 12 drawn out from reel 13 to a component suction position; cover tape drawing-in device 23 that peels off cover tape 22 from component supply tape 12 forward of the component pickup position in accordance with feeding operation of component supply tape 12 and draws in cover tape 22 in a direction opposite to the feeding direction of component supply tape 12; and cover tape collection case 24 (cover tape collection section) that collects cover tape 22 drawn in by cover tape drawing-in device 23, are provided.

The component pickup position is in the vicinity of an end portion on a tape feeding direction side of an upper face of cassette case 11. On the end surface in the tape feeding direction of cassette case 11, a connector (not illustrated) for communication and power supply and two positioning pins 20 are provided, and when tape feeder 10 is set on a feeder setting section (not illustrated) of a component mounting machine, by inserting the two positioning pins 20 into positioning holes of the feeder setting section, while positioning tape feeder 10 with respect to the feeder setting section, a connector for communication and power supply of tape feeder 10 is inserted into a connector for communication and power supply of the feeder setting section, tape feeder 10 and the component mounting machine are connected to each other in a state where communication is possible, and operation power is supplied to tape feeder 10 from the component mounting machine side.

The configuration of tape feeding device 21 is not illustrated, but tape feeding device 21 is configured of a sprocket provided in the vicinity of a lower part of the component pickup position, and a motor that rotates and drives the sprocket, and by rotating the sprocket by making teeth of the sprocket mesh with a tape feeding hole formed at a predetermined pitch at a side edge of a side part of component supply tape 12, component supply tape 12 is pitch fed to the component pickup position.

Cover tape drawing-in device 23 is configured of tape presser 25 for peeling off cover tape 22 from the upper surface of component supply tape 12 by pressing component supply tape 12 forward of the component pickup position, cover tape drawing-in gear mechanism 26 that feeds the cover tape 22 peeled off by tape presser 25 into cover tape collection case 24 by pulling the cover tape 22 in the direction opposite to the tape feeding direction, and tension roller mechanism 27 that imparts tension to the cover tape 22 peeled off by the tape presser 25. Furthermore, component supply tape 12 (carrier tape) from which the cover tape 22 is peeled off is guided to the lower portion side of tape feeder 10, is discharged downward, and is collected in a waste tape collection box (not illustrated) disposed in a lower section of the component mounting machine.

Figure 2:
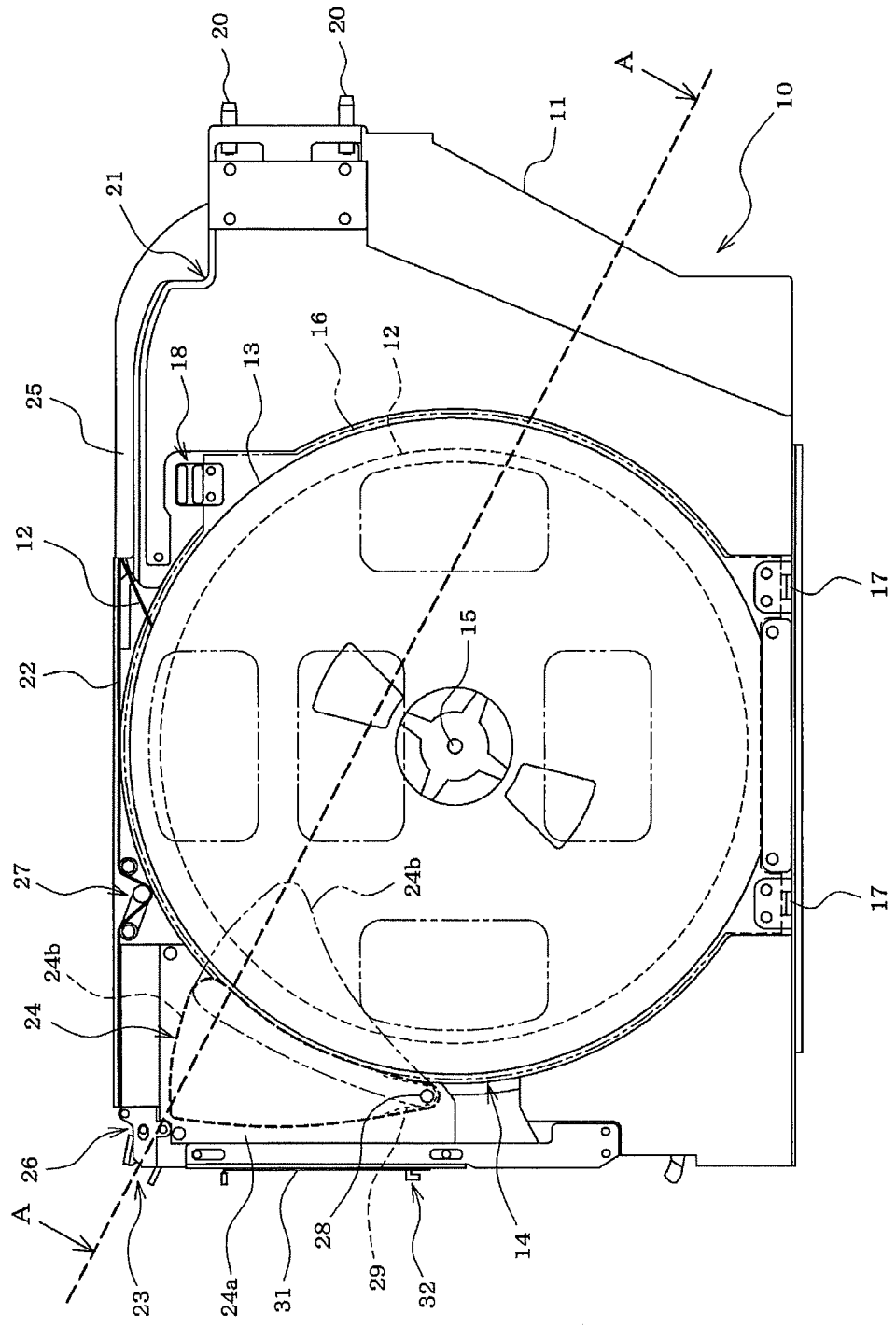
FIG. 2 is a side view of the cassette type tape feeder in which a reel pressing cover is detached.

Cover tape collection case 24 is configured to be disposed to be adjacent to reel 13 in the upper portion on the detaching direction side of cassette case 11, and to expand a collection capacity of cover tape 22 into the vacant space in reel 13 corresponding to the increase in the collection amount of the cover tape 22. Hereinafter, the configuration of cover tape collection case 24 will be described. Cover tape collection case 24 is configured of fixed case section 24a fixed to cassette case 11, and movable case section 24b (expandable part) that expands the capacity of cover tape collection case 24 by being displaced in a direction (expanding direction) of the vacant space corresponding to the increase in the collection amount of cover tape 22. Movable case section 24b is supported to be movable by shaft 28 positioned in the lower end portion thereof, and is biased to rotate in a reducing direction (counterclockwise direction of FIG. 2) by torsion coil spring 29 (biasing means). Movable case section 24b can enter and exit fixing case section 24a by rotating around shaft 28, and movable case section 24b is also formed to be capable of moving in and out of the vacant space in reel 13 that increases in accordance with the decrease in the amount of remaining tape in reel 13.

On the end surface on the side opposite to the feeding direction of component supply tape 12 in fixed case section 24a of cover tape collection case 24, disposal port cover 31 that opens and closes a disposal port (not illustrated) of cover tape collection case 24 is provided to be openable and closable via a shaft (not illustrated) on the upper end portion side, and lock mechanism 32 that locks and unlocks disposal port cover 31 is provided at the closed position. In a case of disposing of cover tape 22 in cover tape collection case 24, after the operator opens disposal port cover 31 by unlocking lock mechanism 32, and opens disposal port of the cover tape collection case 24, cover tape 22 in cover tape collection case 24 is taken out from the disposal port and is disposed of. After this, when closing disposal port cover 31, a state occurs where disposal port cover 31 is automatically locked at the closed position by lock mechanism 32. Furthermore, similar to the unlocking operation, the locking operation of lock mechanism 32 may be configured to be manually operated by an operator.

Figure 3:
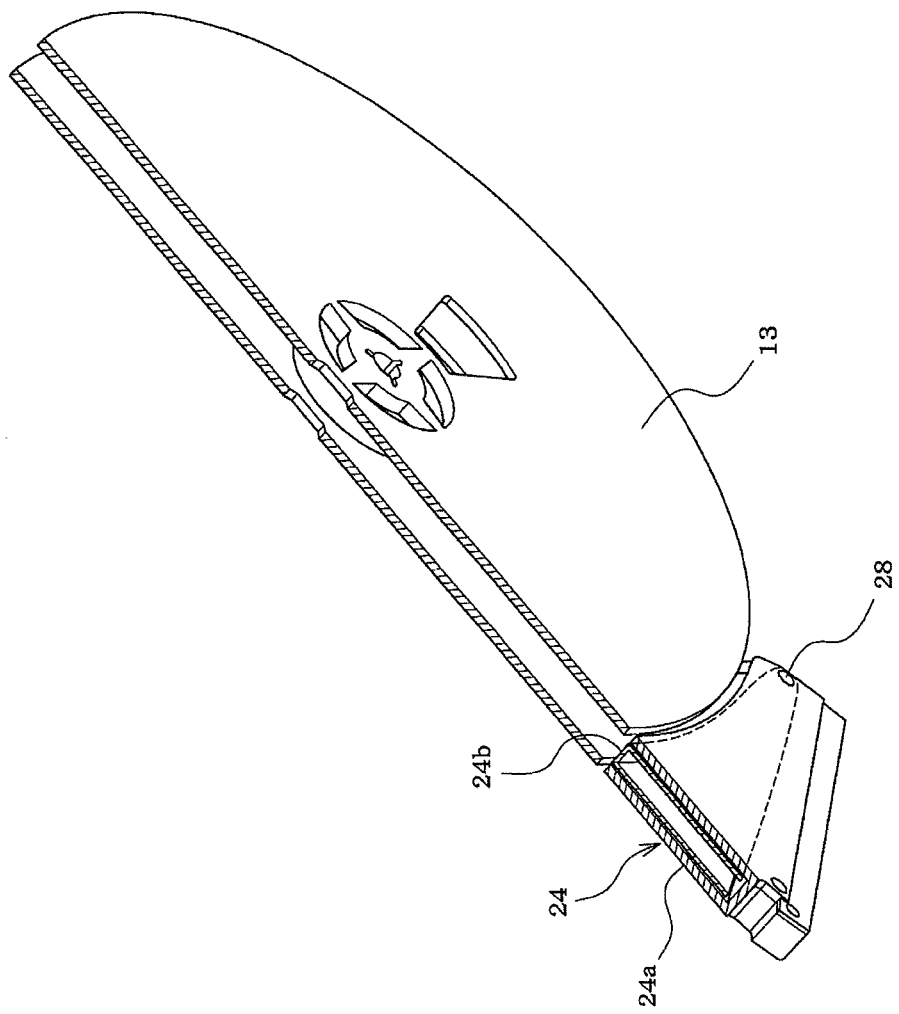
FIG. 3 is a perspective view in which a reel and a cover tape collection case are cut along line A-A of FIG. 2.

In a case where the inside of cover tape collection case 24 is empty, or in a case where the collection amount of cover tape 22 is small, as illustrated in FIG. 3, a state where movable case section 24b is drawn into fixing case section 24a by torsion coil spring 29, and the capacity of cover tape collection case 24 is reduced to the minimum, is maintained. In this state, a state where movable case section 24b is drawn out from reel 13 by torsion coil spring 29 is maintained, a slight void is formed between movable case section 24b and reel 13, and the attachment and detachment (exchange) of reel 13 becomes possible.

Figure 4:
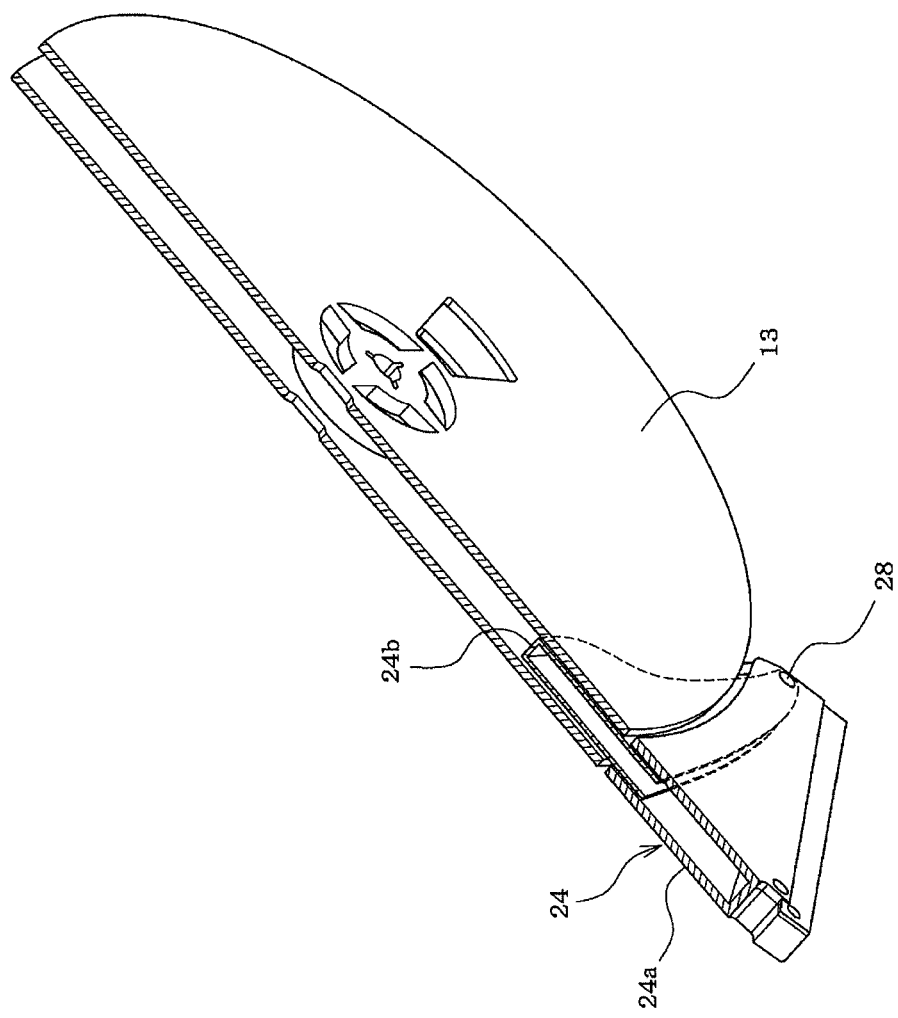
FIG. 4 is a view corresponding to FIG. 3 illustrating a state where a movable case section of the cover tape collection case is pressed out into the reel.

When operating tape feeder 10, cover tape 22 peeled off from the upper surface of component supply tape 12 by cover tape drawing-in device 23 in accordance with the feeding operation of component supply tape 12 is collected in cover tape collection case 24. Accordingly, when a state occurs where the cavity in cover tape collection case 24 is filled with cover tape 22, after this, movable case section 24b is pressed by the cover tape 22 packed in cover tape collection case 24 by cover tape drawing-in device 23, and accordingly, as illustrated in FIG. 4, movable case section 24b is gradually pressed out in the direction of the vacant space in reel 13 which is the expanding direction against the biasing force of torsion coil spring 29, and movable case section 24b gradually enters further into reel 13. Accordingly, as the amount of the cover tape 22 fitted into cover tape collection case 24 increases, the capacity of cover tape collection case 24 expands.

Even when a state occurs in which movable case section 24b of cover tape collection case 24 enters into reel 13, movable case section 24b is biased to rotate in the reducing direction (counterclockwise direction of FIG. 2) by torsion coil spring 29, and thus, movable case section 24b is prevented from being pressed to component supply tape 12 wound around reel 13 by torsion coil spring 29, or the pressing force is mitigated, and the load (resistance force) of the feeding operation of component supply tape 12 is prevented from becoming excessive.

Next, an order of work for exchanging reel 13 of tape feeder 10 detached from the component mounting machine will be described.

While the state where movable case section 24b of cover tape collection case 24 is inside reel 13 is maintained, it is not possible to detach reel 13 in the axial direction, and movable case section 24b becomes an obstacle that interferes with the exchange of reel 13. Therefore, in this case, after disposing of cover tape 22 in cover tape collection case 24 as follows, reel 13 is exchanged. First, after the operator opens disposal port cover 31 by unlocking lock mechanism 32 of cover tape collection case 24, and opens the disposal port of cover tape collection case 24, cover tape 22 in cover tape collection case 24 is disposed of by taking out the cover tape 22 via the disposal port. Accordingly, when the inside of cover tape collection case 24 is empty, as illustrated in FIG. 3, the state returns to one in which movable case section 24b is drawn into fixed case section 24a by torsion coil spring 29 and is drawn out from reel 13, such that exchange of reel 13 becomes possible. After this, the operator opens reel pressing cover 16 by unlocking lock mechanism 18, detaches reel 13 from reel holding shaft 15, and attaches the next reel 13 by fitting the reel 13 to reel holding shaft 15. Furthermore, when reel pressing cover 16 or disposal port cover 31 are respectively closed, a state occurs where reel pressing cover 16 or disposal port cover 31 is automatically locked at the closed position by lock mechanisms 18 and 32.

Meanwhile, in a case where the inside of cover tape collection case 24 is empty, or in a case where the collection amount of cover tape 22 is small, and the state in which movable case section 24b is drawn into fixed case section 24a by torsion coil spring 29 and is drawn out from reel 13 is maintained, it is possible to exchange the reel 13. Therefore, in this case, reel pressing cover 16 may be opened by unlocking lock mechanism 18, and the exchange of reel 13 may be performed.

According to the embodiment described above, since cover tape collection case 24 is configured to expand to the vacant space in reel 13 corresponding to the increase in collection amount of cover tape 22, the cover tape collection case 24 is reduced to a minimum size at first, and can gradually expand corresponding to the increase in the collection amount of cover tape 22 as tape feeder 10 operates. Accordingly, the space that cover tape collection case 24 occupies in tape feeder 10 is reduced to a minimum, the requirement a small and thin tape feeder 10 is satisfied, and it is possible to collect cover tape 22 of component supply tape 12 for an entire reel 13 in cover tape collection case 24.

However, in the embodiment, since movable case section 24b of cover tape collection case 24 expands to the vacant space in reel 13 that increases in accordance with the decrease in the amount of tape remaining on reel 13, it is possible to efficiently use the vacant space in reel 13 that increases in accordance with the decrease in the amount of tape remaining in reel 13 as a vacant space to which the cover tape collection case 24 expands, thus contributing to reducing the size and the thickness of tape feeder 10.

Furthermore, in the embodiment, since movable case section 24b of cover tape collection case 24 is biased in the reducing direction by torsion coil spring 29, even after feeding operation of component supply tape 12 is started and the collection of cover tape 22 in cover tape collection case 24 is initiated, before movable case section 24b of cover tape collection case 24 enters into reel 13, movable case section 24b is held in a state drawn out from reel 13 by torsion coil spring 29, and thus, it is possible to exchange reel 13. In addition, in a case of exchanging reel 13 after the state occurs where movable case section 24b of cover tape collection case 24 is inside reel 13, only when the operator takes out cover tape 22 from cover tape collection case 24 does the state return to one in which movable case section 24b of cover tape collection case 24 is drawn out from reel 13 by torsion coil spring 29, making it possible to exchange reel 13. Accordingly, it is possible to simply perform the exchange work of reel 13.

In addition, while operating tape feeder 10, it is possible to prevent movable case section 24b of cover tape collection case 24 from being pressed to component supply tape 12 wound around reel 13 by torsion coil spring 29, or to mitigate the pressing force, to prevent the load (resistance force) of the feeding operation of component supply tape 12 from becoming excessive, and to prevent problems with feeding operation of component supply tape 12.

However, the present disclosure may be configured such that movable case section 24b of cover tape collection case 24 is biased to the inner side (expanding direction) of reel 13 by the biasing means, and in this case, a roller or the like that reduces friction resistance between movable case section 24b and component supply tape 12 is provided on movable case section 24b, the load (resistance force) of feeding operation of component supply tape 12 is prevented from becoming excessive, an operating mechanism that rotates and operates movable case section 24b in the reducing direction (counterclockwise direction of FIG. 2) when exchanging reel 13 is provided, and reel 13 can be exchanged by operation of the operating mechanism.

Furthermore, the biasing means for biasing movable case section 24b in the reducing direction or in the expanding direction is not limited to a torsion coil spring, and other types of springs, an elastic member, gravity, a magnetic force or the like may be used.

In addition, the present disclosure is not limited to the configuration in which the cover tape collection section (cover tape collection case 24) expands to the vacant space inside reel 13, and when another vacant space into which the cover tape collection section may expand exists in cassette case 11, the cover tape collection section may expand to the other vacant space. Otherwise, the cover tape collection section may expand to a vacant space on the outer side (for example, detaching direction side) of tape feeder 10 when tape feeder 10 is attached to the component mounting machine.

In addition, as a means that configures the cover tape collection section to be expandable, for example, an elastic member, such as a bellows structure or rubber, may be used.

In addition, the present disclosure is not limited to the cassette type tape feeder as described in the embodiment above, and as long as the tape feeder is a tape feeder on which the reel is loaded, any type of tape feeder can also be employed, and various changes, such as a change in configuration in which the cover tape collection section is reduced, or a change in configuration of each mechanism of the tape feeder, are possible without departing from the spirit of the disclosure.

REFERENCE SIGNS LIST

10: tape feeder, 11: cassette case, 12: component supply tape, 13: reel, 14: reel loading section, 15: reel holding shaft, 16: reel pressing cover, 21: tape feeding device, 22: cover tape, 23: cover tape drawing-in device, 24: cover tape collection case (cover tape collection section), 24a: fixing case section, 24b: movable case section (expandable part), 25: tape presser, 26: cover tape drawing-in gear mechanism, 27: tension roller mechanism, 29: torsion coil spring (biasing means), 31: disposal port cover

The invention claimed is:
1. A tape feeder comprising:
a tape feeding device configured to draw out a component supply tape wound around a reel, and feed the component supply tape to a component pickup position;
a cover tape drawing-in device configured to peel off a cover tape from an upper face of the component supply tape forward of the component pickup position in accordance with a feeding operation of the component supply tape, and draw in the cover tape in a direction opposite to a feeding direction of the component supply tape;
a cover tape collection section configured to collect the cover tape drawn in by the cover tape drawing-in device; and
a cassette case in which the reel and the cover tape collection section is housed,
wherein the cover tape collection section is configured to expand to a vacant space inside the cassette case in accordance with an increase in collection amount of the cover tape.
2. The tape feeder according to claim 1,
wherein the cover tape collection section is configured such that an expandable part thereof expands to the vacant space in the reel that becomes larger in accordance with a decrease in an amount of remaining tape on the reel.
3. The tape feeder according to claim 1,
wherein the cover tape collection section is configured such that the expandable part thereof is biased in a reducing direction by a biasing means, the expandable part is pressed by the cover tape packed in the cover tape collection section by the cover tape drawing-in device, and thus, the expandable part is pushed out in the expanding direction against a biasing force of the biasing means.
4. The tape feeder according to claim 1,
wherein the cover tape collection section is configured of a fixed case section, and a movable case section configured to enter and exit the fixing case section, the cover tape collection section is configured to become smaller as the movable case section goes into the fixed case section, and the cover tape collection section is configured to expand as the movable case section is displaced from the fixed case section towards the vacant space.

5. The tape feeder according to claim 1,
wherein the reel, the tape feeding device, the cover tape drawing-in device, and the cover tape collection section are provided in the cassette case.

6. A tape feeder comprising:
a tape feeding device configured to draw out a component supply tape wound around a reel, and feed the component supply tape to a component pickup position;
a cover tape drawing-in device configured to peel off a cover tape from an upper face of the component supply tape forward of the component pickup position in accordance with a feeding operation of the component supply tape, and draw in the cover tape in a direction opposite to a feeding direction of the component supply tape; and
a cover tape collection section configured to collect the cover tape drawn in by the cover tape drawing-in device,
wherein the cover tape collection section is configured to expand to a vacant space in accordance with an increase in collection amount of the cover tape, and
wherein the cover tape collection section is configured such that an expandable part thereof expands to the vacant space in the reel that becomes larger in accordance with a decrease in an amount of remaining tape on the reel.

7. The tape feeder according to claim 6,
wherein the cover tape collection section is configured such that the expandable part thereof is biased in a reducing direction by a biasing means, the expandable part is pressed by the cover tape packed in the cover tape collection section by the cover tape drawing-in device, and thus, the expandable part is pushed out in the expanding direction against a biasing force of the biasing means.

8. The tape feeder according to claim 6,
wherein the cover tape collection section is configured of a fixed case section, and a movable case section configured to enter and exit the fixing case section, the cover tape collection section is configured to become smaller as the movable case section goes into the fixed case section, and the cover tape collection section is configured to expand as the movable case section is displaced from the fixed case section towards the vacant space.

9. The tape feeder according to claim 6,
wherein the reel, the tape feeding device, the cover tape drawing-in device, and the cover tape collection section are provided in a cassette case.

* * * * *